United States Patent
Yu et al.

(10) Patent No.: US 9,302,466 B2
(45) Date of Patent: Apr. 5, 2016

(54) INK COMPOSITION USABLE IN SOLAR BATTERY MANUFACTURING PROCESS, AND METHOD OF FORMING PATTERN USING THE SAME

(71) Applicant: LG CHEM, LTD., Seoul (KR)

(72) Inventors: Min-A Yu, Daejeon (KR); Yong-Sung Goo, Seoul (KR); Joon-Hyung Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/126,189

(22) PCT Filed: May 3, 2013

(86) PCT No.: PCT/KR2013/003882
§ 371 (c)(1),
(2) Date: Dec. 13, 2013

(87) PCT Pub. No.: WO2013/165223
PCT Pub. Date: Nov. 7, 2013

(65) Prior Publication Data
US 2014/0199527 A1    Jul. 17, 2014

(30) Foreign Application Priority Data

May 3, 2012 (KR) .................. 10-2012-0046866
May 3, 2013 (KR) .................. 10-2013-0050314

(51) Int. Cl.
*C09D 11/101* (2014.01)
*B41J 2/01* (2006.01)
(Continued)

(52) U.S. Cl.
CPC ............... *B41J 2/01* (2013.01); *C09D 11/101* (2013.01); *C09D 11/38* (2013.01); *H01L 31/1804* (2013.01); *G03F 7/004* (2013.01); *G03F 7/0045* (2013.01); *G03F 7/0046* (2013.01); *G03F 7/0388* (2013.01); *G03F 7/0397* (2013.01); *G03F 7/20* (2013.01); *Y02E 10/50* (2013.01); *Y02P 70/521* (2015.11); *Y10T 428/24802* (2015.01)

(58) Field of Classification Search
CPC ... G03F 7/0045; G03F 7/0046; G03F 7/0397; G03F 7/0392; G03F 7/0388; G03F 7/004; G03F 7/20; C09D 11/101; B41J 2/01
USPC .............. 430/283.1, 285.1, 287.1; 428/195.1
See application file for complete search history.

(56) References Cited

U.S. PATENT DOCUMENTS

| | | | |
|---|---|---|---|
| 2006/0060563 A1* | 3/2006 | Kim et al. | 216/41 |
| 2007/0139502 A1* | 6/2007 | Held et al. | 347/100 |
| 2009/0163615 A1 | 6/2009 | Halahmi et al. | |

FOREIGN PATENT DOCUMENTS

| | | |
|---|---|---|
| CN | 101354533 A | 1/2009 |
| CN | 101771102 A | 7/2010 |
| KR | 1020090005990 | 1/2009 |
| KR | 100955977 | 4/2010 |

(Continued)

*Primary Examiner* — Bethelhem Shewareged
(74) *Attorney, Agent, or Firm* — Dentons US LLP

(57) ABSTRACT

Provided are an ink composition usable in a solar battery manufacturing process, a method of forming a pattern using the ink composition, an insulation film formed of the ink composition, and an etching mask formed of the ink composition. The ink composition includes: a) a polymerizable compound having an ethylenically unsaturated bond; b) a fluorinated surfactant; and c) a solvent, wherein the ink composition has a solid content of 45 parts by weight to 99.99 parts by weight.

20 Claims, 4 Drawing Sheets

(51) Int. Cl.
*H01L 31/18* (2006.01)
*C09D 11/38* (2014.01)
*G03F 7/039* (2006.01)
*G03F 7/038* (2006.01)
*G03F 7/004* (2006.01)
*G03F 7/20* (2006.01)

(56) References Cited

FOREIGN PATENT DOCUMENTS

| KR | 100983010 | 9/2010 |
| KR | 1020110120211 | 11/2011 |
| KR | 1020120038360 | 4/2012 |

\* cited by examiner

INK COMPOSITION USABLE IN SOLAR BATTERY MANUFACTURING PROCESS, AND METHOD OF FORMING PATTERN USING THE SAME

This application is a national stage entry of International Application No. PCT/KR2013/003882, filed on May 3, 2013, which claims priority to Korean Patent Application Nos. 10-2012-0046866, filed on May 3, 2012 and 10-2013-0050314, filed on May 3, 2013, with the Korean Patent Office, all of which are incorporated herein in their entirety by reference.

TECHNICAL FIELD

The present invention relates to an ink composition adjustable in terms of fluidity for forming a pattern on an uneven silicon substrate in a solar battery manufacturing process, and a method of forming a pattern using the ink composition.

BACKGROUND ART

Solar batteries converting solar energy into electric energy are core devices in solar energy generation. Currently, solar batteries are used in various fields to supply electricity to electrical or electronic products, houses, buildings, etc.

Processes for manufacturing solar batteries include an electroplating process and an etching process. Such processes require materials for selectively masking certain regions of a silicon substrate and forming an insulation film on solar cells. In the related art, such materials are usually applied to substrates by screen printing methods. In this case, however, it is difficult to obtain fine line widths necessary for solar batteries.

In addition, there have been attempts made to use thin silicon substrates for reducing manufacturing costs of solar batteries. In this case, if a screen printing method is used, solar cells may be easily damaged or broken due to patterns being formed through physical contact in the screen printing method.

Therefore, there is increasing interest in techniques for forming patterns using non-contact type inkjet printing methods instead of contact type screen printing methods. That is, electrode patterns, etching-film patterns, or insulation-film patterns having fine line widths can be formed by a non-contact method if an inkjet printing method is used.

However, conventional ink compositions for inkjet printing may be highly viscous, and thus it may be difficult to form a pattern on an uneven silicon substrate using such a conventional ink composition in a solar battery manufacturing process because the ink composition may flow across the uneven silicon substrate. Therefore, it is necessary to develop an ink composition that can be used to form a pattern on an uneven silicon substrate in an inkjet printing process.

DISCLOSURE

Technical Problem

Aspects of the present invention provide an ink composition adjustable in terms of fluidity for forming a pattern on an uneven silicon substrate in a solar battery manufacturing process, and a method of forming a pattern using the ink composition.

Technical Solution

According to an aspect of the present invention, there is provided an ink composition usable in a solar battery manufacturing process, the ink composition including: a) a polymerizable compound having an ethylenically unsaturated bond; b) a fluorinated surfactant; and c) a solvent, wherein the ink composition has a solid content of 45 parts by weight to 99.99 parts by weight based on the total weight of the ink composition.

According to another aspect of the present invention, there is provided a method of forming a pattern, the method including: applying the ink composition using an inkjet print head of an inkjet printer; and thermally treating the applied ink composition.

According to another aspect of the present invention, there is provided an etching mask formed of the ink composition on an uneven silicon substrate for manufacturing a solar battery.

According to another aspect of the present invention, there is provided an insulation film formed of the ink composition on an uneven silicon substrate for manufacturing a solar battery.

Advantageous Effects

According to the present invention, the ink composition usable in a solar battery manufacturing process can be adjusted in fluidity by varying the solid content of the ink composition, and thus a pattern can be formed of the ink composition even on an uneven silicon substrate.

Furthermore, since a non-contact type inkjet printer is used in the method of forming a pattern using the ink composition, fine lines of the pattern can be properly formed by the method, and thus the method may be useful for forming solar batteries.

Furthermore, in solar battery manufacturing processes, the ink composition can be used to form an insulation film or an etching mask by adjusting the concentration of an adhesion promoter included in the ink composition and the temperature of a thermal treatment in a pattern forming process.

BEST MODE

Figure 1:
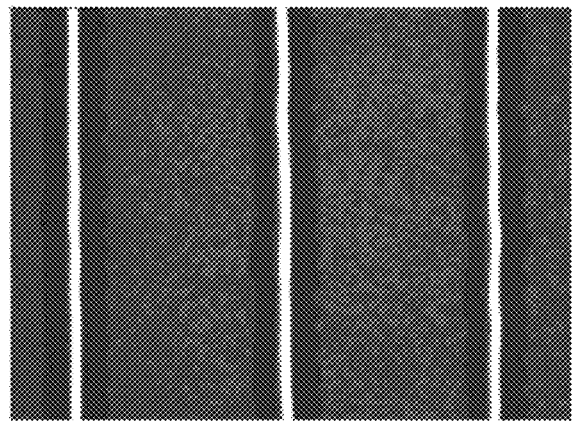
FIG. 1 is an image of a pattern formed by ejecting an ink composition prepared in Example 1 onto an uneven silicon substrate.

Hereinafter, embodiments of the invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the present invention to those skilled in the art.

An embodiment of the invention provides an ink composition usable in a solar battery manufacturing process. The ink composition includes a) a polymerizable compound having an ethylenically unsaturated bond, b) a fluorinated surfactant, and c) a solvent. The ink composition has a solid content of 45 parts by weight to 99.99 parts by weight based on the total weight of the ink composition.

a) The polymerizable compound having an ethylenically unsaturated bond has radicals for polymerization. The polymerizable compound having an ethylenically unsaturated bond is included in the ink composition to increase the durability of a pattern formed of the ink composition. The polymerizable compound having an ethylenically unsaturated bond has viscosity so that the fluidity of the ink composition on an uneven silicon substrate may be adjusted by the polymerizable compound having an ethylenically unsaturated bond.

In the current embodiment, a) the polymerizable compound having an ethylenically unsaturated bond of the ink composition may be an acrylic monomer. Specifically, the polymerizable compound having an ethylenically unsaturated bond may be a crosslinkable multifunctional acrylate. For example, the polymerizable compound having an ethylenically unsaturated bond may include at least two selected from the group consisting of neopentyl glycol diacrylate, ditrimethylolpropane tetraacrylate, dipentaerythritol tetraacrylate, dipentaerythritol pentaacrylate, dipentaerythritol hexaacrylate, dipropylene glycol diacrylate, butanediol diacrylate, ethylene glycol diacrylate, triethylene glycol diacrylate, trimethylol triacrylate, trimethylolpropane triacrylate, tripropylene glycol diacrylate, pentaerythritol triacrylate, propylene glycol diacrylate, and hexanediol diacrylate. However, the polymerizable compound having an ethylenically unsaturated bond is not limited thereto.

Particularly, in the current embodiment, the polymerizable compound having an ethylenically unsaturated bond of the ink composition may be dipentaerythritol hexaacrylate, trimethylolpropane triacrylate, and/or dipropylene glycol diacrylate. The dipentaerythritol hexaacrylate and the trimethylolpropane triacrylate are multifunctional acrylates that can be cross-linked with each other for increasing the chemical resistance of the ink composition. The dipropylene glycol diacrylate has a low degree of viscosity, and thus the ink composition including the dipropylene glycol diacrylate may be easily ejected through an inkjet print head.

The ink composition may include 40 parts by weight to 98 parts by weight, 60 parts by weight to 96 parts by weight, or 70 parts by weight to 94 parts by weight of a) the polymerizable compound having an ethylenically unsaturated bond, based on the total weight of the ink composition. In this case, a high-quality line pattern may be formed on an uneven silicon substrate using the ink composition, and an additive or surfactant may be added to the ink composition to increase the adhesiveness of the ink composition or control the spreading properties of the ink composition.

b) The fluorinated surfactant is included in the ink composition to control the spreading properties of the ink composition. The fluorinated surfactant may have a high degree of antifoaming properties to prevent the formation of bubbles or remove bubbles when the ink composition is supplied to an inkjet printing apparatus and thus to prevent ink ejection errors caused by bubbles.

In the ink composition of the current embodiment of the invention, b) the fluorinated surfactant may include polyethylene glycol and a perfluorocarbon. In this case, the spreading properties of the ink composition may be easily controlled, and the ink composition may not easily flow. Therefore, a pattern may be easily formed on an uneven silicon substrate using the ink composition.

In the current embodiment of the invention, for example, when a toluene solution including 0.1 wt % of the fluorinated surfactant is prepared, the surface tension of the toluene solution may be within 20 mN/m to 30 mN/m, or 23 mN/m to 27 mN/m. In another example, when a propylene glycol methyl ether solution including 0.1 wt % of the fluorinated surfactant is prepared, it may be preferable that the surface tension of the propylene glycol methyl ether solution be within 20 mN/m to 30 mN/m, or 24 mN/m to 28 mN/m. In the ink composition of the current embodiment of the invention, both the toluene solution including 0.1 wt % of the fluorinated surfactant and the propylene glycol methyl ether solution including 0.1 wt % of the fluorinated surfactant may have surface tensions within the above-mentioned ranges. In this case, the ink composition may properly cover an uneven silicon substrate and may not spread excessively on the uneven silicon substrate. Therefore, a pattern may be stably formed and maintained on the uneven silicon substrate. Herein, the term "surface tension" denotes tension between air and the solution. In addition, surface tension values were measured at room temperature using a Du Nouy Ring tension meter.

The ink composition may include 0.01 parts by weight to 1.0 part by weight of the fluorinated surfactant, 0.01 parts by weight to 0.5 parts by weight of the fluorinated surfactant, or 0.03 parts by weight to 0.1 parts by weight of the fluorinated surfactant, based on the total weight of the ink composition. In this case, patterns may be formed with a high degree of reproducibility using the ink composition, and the storability of the ink composition may be improved.

c) The solvent may be an organic solvent for controlling the viscosity of the ink composition and the thickness of a film formed of the ink composition. For example, the solvent may include at least one selected from the group consisting of diethylene glycol butyl methyl ether, diethylene glycol monobutyl ether acetate, diethylene glycol monomethyl ether acetate, diethylene glycol monoethyl ether, diethylene glycol monoethyl ether acetate, dipropylene glycol methyl ether acetate, butyl lactate, ethoxyethyl acetate, ethylene glycol monobutyl ether, ethylene glycol monobutyl ether acetate, ethyl ethoxy propionate, propylene glycol methyl ether acetate, propylene glycol monoethyl ether, and propylene glycol butyl ether. However, the solvent is not limited thereto.

The ink composition may include 0.001 parts by weight to 55 parts by weight of c) the solvent based on the total weight of the ink composition. In this case, spreading of the ink composition may be reduced, and thus a line pattern may be uniformly formed using the ink composition.

In other words, it may be preferable that the ink composition have a solid content (excluding c) the solvent) within the range of 45 parts by weight to 99.99 parts by weight, 63 parts by weight to 99.99 parts by weight, or 70 parts by weight to 99.99 parts by weight, based on the total weight of the ink composition. As the solid content increases, the ink composition may spread less, and thus a uniform pattern may be stably formed of the ink composition.

The solvent may be a mixture of one or more substances each having a boiling point of 140° C. to 250° C. In this case, the ink composition may not dry on the surfaces of nozzles of an inkjet printer, and thus the ink composition may be smoothly ejected through the nozzles. After a pattern is formed of the ink composition, the solvent may be completely evaporated. That is, the productivity of a pattern forming process may be improved.

Optionally, the ink composition of the current embodiment may further include an adhesion promoter to increase adhesion to a silicon substrate. If the ink composition of the current embodiment is used to form an etching mask on a substrate in a solar batter manufacturing process, owing to the increased adhesion of the ink composition, separation of a pattern may be prevented when the substrate is treated with an acid solution to selectively etch an emitter layer.

The adhesion promoter may include a substituent forming a silanol group through hydrolysis, or molecules of the adhesive promoter may include a methoxy silyl group or an ethoxy silyl group. The adhesion promoter may include at least one selected from the group consisting of vinyltrimethoxysilane, vinyltriethoxysilane, glycidoxypropyltrimethoxysilane, glycidoxypropyltriethoxysilane, methacryloxypropyltrimethoxysilane, and methacryloxypropyltriethoxysilane. However, the adhesion promoter is not limited thereto.

The ink composition may include 0.1 parts by weight to 5.0 parts by weight of the adhesion promoter based on the total weight of the ink composition. In this case, the storability of the ink composition can be improved. In addition, when the ink composition is used to form an etching mask, separation or breakage of a pattern may be prevented during an acid solution treatment.

Optionally, the ink composition of the current embodiment may further include at least one additive selected from the group consisting of a polymerization initiator and a binder.

The polymerization initiator may include a thermal initiator, a photoinitiator, or a combination thereof, so as to harden the polymerizable compound having an ethylenically unsaturated bond. If the polymerization initiator includes a thermal initiator, the ink composition may be hardened by removing the solvent from the ink composition through a one-step heat treatment process without having to perform an additional process.

It may be preferable that the ink composition include 0.1 parts by weight to 5.0 parts by weight of the polymerization initiator based on the total weight of the ink composition. In this case, sufficient radicals may be guaranteed for thermal polymerization, and the polymerization initiator may be sufficiently dissolved to reduce surface defects when an insulation film is formed of the ink composition. In addition, an etching mask formed of the ink composition may be easily removed using a stripper.

For example, the thermal initiator may include at least one selected from the group consisting of azo compounds, organic peroxides, and hydrogen peroxide. However, the thermal initiator is not limited thereto.

The photoinitiator may include a photopolymerization initiator or photosensitizer known in the related art. However, the photoinitiator is not limited thereto. For example, the photoinitiator may include at least one selected from the group consisting of triazine compounds, non-imidazole compounds, acetophenone compounds, benzophenone compounds, and thioxanthone compounds.

When an ink film is formed of the ink composition, the binder may increase the adhesion of the ink film, facilitate formation of the ink film, and adjust the strength of the ink film. The type or kind of the binder is not limited, as long as the binder does not have an influence on the properties of the ink composition. For example, the binder may include a copolymer of one or more selected from the group consisting of styrene, chlorostyrene, α-methyl styrene, vinyl toluene, 2-ethylhexyl(meth)acrylate, methyl(meth)acrylate, ethyl (meth)acrylate, butyl(meth)acrylate, benzyl(meth)acrylate, glycidyl(meth)acrylate, dimethylaminoethyl(meth)acrylate, isobutyl(meth)acrylate, t-butyl(meth)acrylate, cyclohexyl (meth)acrylate, dicyclopentanyl(meth)acrylate, isobutyl (meth)acrylate, 2-phenoxyethyl(meth)acrylate, tetrahydrofurfuryl(meth)acrylate, hydroxyethyl(meth)acrylate, 2-hydroxyethyl(meth)acrylate, 2-hydroxypropyl(meth)acrylate, 2-hydroxy-3-chloropropyl(meth)acrylate, 2-hydroxybutyl(meth)acrylate, 4-hydroxybutyl(meth)acrylate, dimethylaminomethyl(meth)acrylate, diethylamino(meth) acrylate, acyloctyloxy-2-hydroxypropyl(meth)acrylate, ethylhexyl acrylate, 2-methoxyethyl(meth)acrylate, 3-methoxybutyl(meth)acrylate, butoxyethyl(meth)acrylate, ethoxydiethyleneglycol(meth)acrylate, methoxytriethyleneglycol (meth)acrylate, methoxytripropyleneglycol(meth)acrylate, methoxypolyethyleneglycol(meth)acrylate, phenoxydiethyleneglycol(meth)acrylate, p-nonylphenoxypolyethyleneglycol(meth)acrylate, p-nonylphenoxypolypropyleneglycol (meth)acrylate, tetrafluoropropyl(meth)acrylate, 1,1,1,3,3,3-hexafluoroisopropyl(meth)acrylate, octafluoropentyl(meth) acrylate, heptadecafluorodecyl(meth)acrylate, tribromophenyl(meth)acrylate, methyl α-hydroxymethyl acrylate, ethyl α-hydroxymethyl acrylate, propyl α-hydroxymethyl acrylate, butyl α-hydroxymethyl acrylate, lauryl methacrylate, N-phenylmaleimide, N-(4-chlorophenyl) maleimide, methacrylic acid, maleic acid, and itaconic acid. However, the binder is not limited thereto. It may be preferable that the binder have an average molecular weight of 4,000 to 50,000.

It may be preferable that the ink composition include 0.01 parts by weight to 8 parts by weight of the binder, based on the total weight of the ink composition. In this case, the viscosity of the ink composition may not be high, and thus a pattern may easily be formed of the ink composition.

In the current embodiment of the invention, it is preferable that the ink composition usable in a solar battery manufacturing process have a contact angle of 30° to 60°. Herein, the term "contact angle" denotes that when an ink droplet is dropped on a base, the angle between the surface of the base and a line extending from the contact point between the base and the ink droplet and tangent to the surface of the ink droplet. For example, the contact angle of an ink droplet may be measured using a contact angle gauge (DSA100 by KRUSS). In embodiments of the invention, the contact angle of an ink droplet dropped on a glass substrate is measured. If the contact angle of an ink (composition) droplet is within the above-mentioned range, the amount of spreading of the ink composition on an uneven silicon substrate may be low, and a pattern having a desired line width may easily be formed. In addition, partial ink clots may be prevented, and thus a pattern may be continuously formed on a substrate with a high degree of adhesion to the substrate.

Next, a method of forming a pattern will be described according to an embodiment of the invention.

The pattern forming method includes: applying the ink composition described in the previous embodiment using a inkjet print head of an inkjet printer; and thermally treating the applied ink composition.

The ink composition may be applied to a glass substrate, a silicon substrate, or a substrate on which a metal, $SiO_2$, or ITO is deposited. For example, the ink composition may be applied to an uneven silicon substrate for forming a solar battery.

The ink composition may be applied to a substrate by a non-contact method using the inkjet print head. The inkjet print head may be heated to decrease the viscosity of the ink composition and thus to make it easy to eject the ink composition through the inkjet print head.

For example, it may be preferable that the inkjet print head be heated to 40° C. to 80° C. for decreasing the viscosity of the ink composition to 10 cP to 20 cP. In this case, since the viscosity of the ink composition is low, the ink composition may be stably ejected through the inkjet print head without causing any errors in a driving unit of the inkjet printer. In addition, the storability of the ink composition may be improved.

The thermal treating of the applied ink composition may be performed using a vacuum dryer, a convection oven, a hot plate, or an IR oven, so as to form a film by drying the ink composition. The thermal treating may be performed within the temperature range of 130° C. to 250° C. If the thermal treating temperature is outside of this range, the film formed by the ink composition may not function as an etching mask or an insulation film due to insufficient hardening, and it may be difficult to remove a pattern in the case of using the film formed by the ink composition as an etching mask. Furthermore, reactants may be partially burned off.

In the pattern forming method using the ink composition according to the embodiment, if the ink composition is used to form an etching mask, the thermal treating of the ink composition may be performed within the temperature range of 160° C. to 200° C. In this case, the etching mask (mask pattern) may have a high degree of resistance to etching environments in the following emitter forming process in which an emitter layer is selectively etched using the etching mask. Therefore, separation or breakage of a pattern may be prevented, and after the emitter forming process, the etching mask may be easily removed using an alkali solution.

In the pattern forming method using the ink composition according to the embodiment, if the ink composition is used to form an insulation film, the thermal treating of the ink composition may be performed within the temperature range of 220° C. to 250° C. In this case, the ink composition may be sufficiently hardened owing to the high thermal treating temperature.

In the current embodiment, an etching mask may be formed on an uneven silicon substrate using the ink composition for forming a solar battery.

The etching mask may be formed by a method known in the related art to which the present invention pertains, or a pattern formed by the pattern forming method of the current embodiment may be used as the etching mask.

If solar batteries are manufactured using etching masks formed using the pattern forming method of the current embodiment, the resistance of the etching masks to etching environments of a selective emitter forming process may be high, and the etching masks may be easily removed using an alkali solution after use. Therefore, solar batteries may be manufactured with high degrees of reproducibility and stability.

In the current embodiment, an insulation film may be formed on an uneven silicon substrate using the ink composition in a solar battery manufacturing process.

The insulation film may be formed by a method known in the related art to which the present invention pertains, or a pattern formed by the pattern forming method of the current embodiment may be used as the insulation film.

MODE FOR INVENTION

Examples

Preparation Example 1

Preparation of Binder A 1.6 parts by weight of V65 being a thermal initiator was dissolved in a solvent in a reaction vessel, and benzyl(meth)acrylate/methacrylic acid were added at a molar ratio of 68/32 to the reaction vessel. Thereafter, the mixture was allowed to react under a nitrogen atmosphere at 65° C. for 7.5 hours. A copolymer solution obtained through the reaction was inserted into a flask equipped with an agitator, and glycidyl (meth)acrylate was added to the flask. Then, the mixture was allowed to react at 110° C. for 6 hours, so as to obtain an acrylic copolymer.

Preparation Example 2

Preparation of Binder B 1.6 parts by weight of V65 being a thermal initiator was dissolved in a solvent in a reaction vessel, and benzyl(meth)acrylate/styrene/methacrylic acid/lauryl methacrylate were added at a molar ratio of 52/19/12/17 to the reaction vessel. Thereafter, the mixture was allowed to react under a nitrogen atmosphere at 65° C. for 7.5 hours, so as to obtain a binder resin.

Example 1

100 parts by weight of an ink composition was prepared according to the present invention by mixing, for 2 hours, 1.00 part by weight of the binder A; 93.24 parts by weight of a polymerizable compound mixture of dipentaerythritol hexaacrylate, trimethylolpropane triacrylate, and dipropylene glycol diacrylate; 2.00 parts by weight of methacryloxypropyltrimethoxysilane; 0.04 parts by weight of a fluorinated surfactant; 0.25 parts by weight of V40 by Wako as an initiator; and 3.47 parts by weight of diethylene glycol methyl butyl ether as a solvent.

The solid content of the ink composition was calculated as the sum of the parts by weight of all the components except the parts by weight of the solvent, based on the total parts by weight of the ink composition, and the viscosity of the ink composition was measured using a viscosity gauge at room temperature (25° C.)

Examples 2 to 3 and Comparative Examples 1 to 4

Ink compositions having components as shown in Table 1 below were prepared in the same manner as in Example 1.

TABLE 1

|  |  | #E1 | E2 | E3 | ##CE1 | CE2 | CE3 | CE4 |
|---|---|---|---|---|---|---|---|---|
| Binder A |  | 1.00 | 1.00 | — | — | 13.14 | 1.00 | 1.00 |
| Binder B |  | — | — | — | 7.88 | — | — | — |
| Polymerizable compound | Mixture of DPHA$^1$/TMPTA$^2$/DPGDA$^3$ | 93.24 | 77.09 | 73.22 | 31.53 | 26.27 | 93.24 | 77.09 |
| Adhesion promoter |  | 2.00 | 1.66 | 1.55 | 0.30 | 0.30 | 2.00 | 1.66 |
| Surfactant |  | 0.04 | 0.04 | 0.04 | 0.04 | 0.04 | 0.04** | 0.04** |
| Initiator | V40 by Wako | 0.25 | 0.21 | 0.19 | 0.25 | 0.25 | 0.25 | 0.21 |

TABLE 1-continued

| | #E1 | E2 | E3 | ##CE1 | CE2 | CE3 | CE4 |
|---|---|---|---|---|---|---|---|
| Solvent Diethylene glycol butyl methyl ether | 3.47 | 20.00 | 25.00 | 60.00 | 60.00 | 3.47 | 20.00 |
| Solid Content (%) | 96.53 | 80.00 | 75.00 | 40.00 | 40.00 | 96.53 | 80.00 |
| Viscosity (cP) | 30.40 | 13.10 | 10.7 | 25.00 | 29.60 | 30.40 | 13.10 |

E: Example,
CE: Comparative Example
DPHA[1]: dipentaerythritol hexaacrylate
TMPTA[2]: trimethylolpropane triacrylate
DPGDA[3]: dipropylene glycol diacrylate
**silicone surfactant Experimental Example Line Pattern Formation The ink compositions prepared in Examples 1 to 3 and Comparative Examples 1 to 4 were ejected onto uneven silicon substrates to form patterns. The ink compositions of Example 1 and Comparative Example 3, the ink composition of Comparative Example 1, and the ink composition of the Comparative Example 2 were ejected through inkjet print heads at 45.5° C., 37.6° C., and 42.7° C., respectively. The ink compositions of Examples 2 and 3 and Comparative Example 4 were ejected through inkjet print heads at room temperature. After forming the patterns, the ink compositions (the patterns) were thermally treated at a temperature of 130° C. or higher so as to remove solvents and harden the polymerizable compound having an ethylenically unsaturated bonds.

It was determined as to whether line patterns were formed of the ink compositions of Examples 1 to 3 and Comparative Examples 1 to 4, and the results are shown in Table 2 below. Line patterns were observed using an optical microscope. Good line patterns are denoted by "O," and cases in which line patterns were not formed, are denoted by "X" in Table 2 below.

TABLE 2

| Nos. | Formation of line patterns |
|---|---|
| Example 1 | O |
| Example 2 | O |
| Example 3 | O |
| Comparative Example 1 | X |
| Comparative Example 2 | X |
| Comparative Example 3 | X |
| Comparative Example 4 | X |

Figure 2:
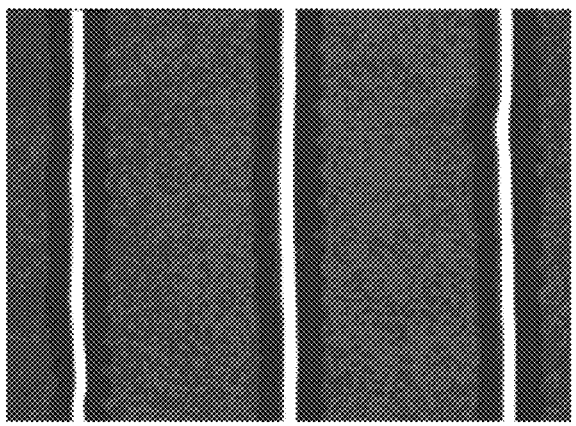
FIG. 2 is an image of a pattern formed by ejecting an ink composition prepared in Example 2 onto an uneven silicon substrate.
Figure 3:
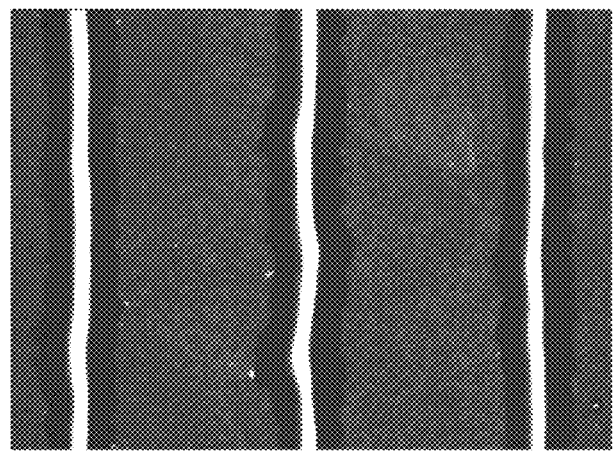
FIG. 3 is an image of a pattern formed by ejecting an ink composition prepared in Example 3 onto an uneven silicon substrate.
Figure 4:
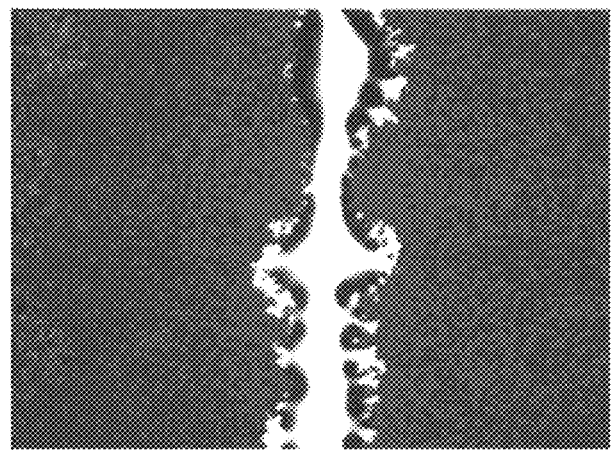
FIG. 4 is an image of a pattern formed by ejecting an ink composition prepared in Comparative Example 1 onto an uneven silicon substrate.
Figure 5:
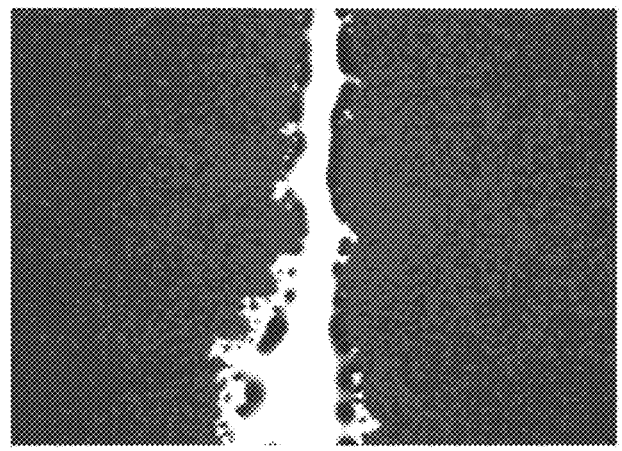
FIG. 5 is an image of a pattern formed by ejecting an ink composition prepared in Comparative Example 2 onto an uneven silicon substrate.
Figure 6:
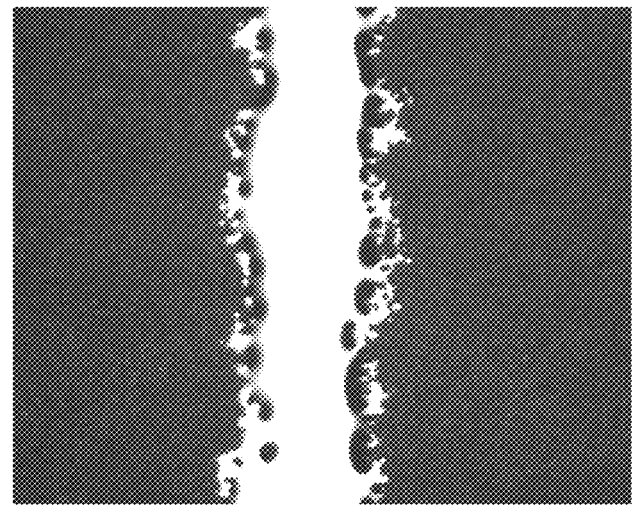
FIG. 6 is an image of a pattern formed by ejecting an ink composition prepared in Comparative Example 3 onto an uneven silicon substrate.
Figure 7:
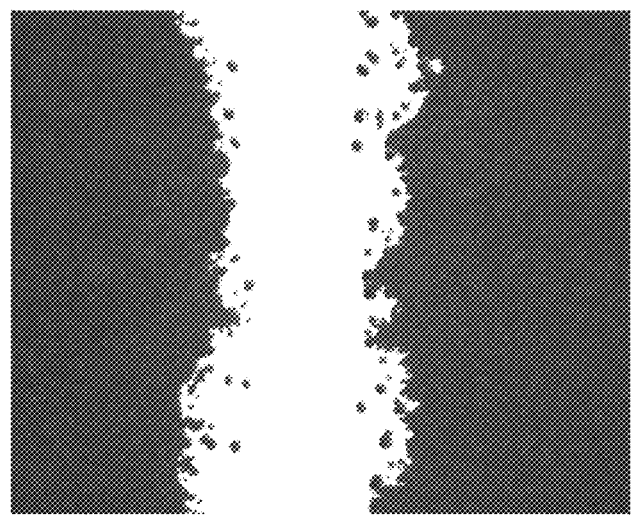
FIG. 7 is an image of a pattern formed by ejecting an ink composition prepared in Comparative Example 4 onto an uneven silicon substrate.

FIGS. 1 to 3 are images of patterns formed by ejecting the ink compositions of Examples 1 to 3 onto uneven silicon substrates, and FIGS. 4 to 7 are images of patterns formed by ejecting the ink compositions of Comparative Examples 1 to 4 onto uneven silicon substrates.

Referring to Table 2 and FIGS. 1 to 3, uniform line patterns were formed of the ink compositions of Examples 1 to 3. As the solid contents of the ink compositions were higher, line patterns were formed more uniformly. However, referring to Table 2 and FIGS. 4 to 7, line patterns were not formed of the ink compositions of Comparative Examples 1 to 4 due to spreading of the ink compositions.

Based on the results, it was found that if the solid content of the ink composition of the embodiment of the invention was 40 parts by weight or less, the uniformity of a pattern formed of the ink composition was decreased. In other words, as the solid content of the ink composition was decreased, the amount of spreading of the ink composition was increased. If the solid content of the ink composition was 40 parts by weight or less, it was difficult to form a line pattern using the ink composition. In addition, after a pattern was formed of the ink composition on an uneven silicon substrate and the solvent was evaporated from the ink composition, tip or edge portions of the uneven silicon substrate for manufacturing a solar battery were not properly covered with the pattern. Furthermore, in the case of not using a fluorinated surfactant, it was difficult to form a line pattern on an uneven substrate using the ink composition although the solid content of the ink composition was high.

While the present invention has been shown and described in connection with the exemplary embodiments, it will be apparent to those skilled in the art that modifications and variations can be made without departing from the spirit and scope of the invention as defined by the appended claims.

The invention claimed is:

1. An ink composition usable in a solar battery manufacturing process, every 100 parts by weight of the ink composition comprising:
    a) 60 parts by weight to 98 parts by weight of a polymerizable compound having an ethylenically unsaturated bond;
    b) 0.01 parts by weight to 1.0 part by weight of a fluorinated surfactant; and
    c) 0.001 parts by weight to 55 parts by weight of a solvent, wherein the ink composition has a solid content of 45 parts by weight to 99.99 parts by weight based on the total weight of the ink composition.

2. An ink composition usable in a solar battery manufacturing process,
    the ink composition comprising:
    a) a polymerizable compound having an ethylenically unsaturated bond;
    b) a fluorinated surfactant; and
    c) a solvent,
    wherein the ink composition has a solid content of 63 parts by weight to 99.99 parts by weight based on the total weight of the ink composition.

3. The ink composition of claim 1, wherein the polymerizable compound having an ethylenically unsaturated bond comprises a mixture of at least two selected from the group consisting of dipentaerythritol hexaacrylate, dipropylene glycol diacrylate, trimethylolpropane triacrylate, and tripropylene glycol diacrylate.

4. The ink composition of claim 1, wherein the fluorinated surfactant comprises polyethylene glycol and a perfluorocarbon.

5. The ink composition of claim 1, wherein a toluene solution comprising 0.1 wt % of the fluorinated surfactant has a surface tension of 20 mN/m to 30 mN/m.

6. The ink composition of claim 1, wherein a toluene solution comprising 0.1 wt % of the fluorinated surfactant has a surface tension of 23 mN/m to 27 mN/m.

7. The ink composition of claim 1, wherein a propylene glycol methyl ether solution comprising 0.1 wt % of the fluorinated surfactant has a surface tension of 20 mN/m to 30 mN/m.

8. The ink composition of claim 1, wherein a propylene glycol methyl ether solution comprising 0.1 wt % of the fluorinated surfactant has a surface tension of 24 mN/m to 28 mN/m.

9. The ink composition of claim 1, wherein the solvent comprises at least one selected from the group consisting of diethylene glycol methyl butyl ether, diethylene glycol monobutyl ether acetate, diethylene glycol monomethyl ether acetate, diethylene glycol monoethyl ether, diethylene glycol monoethyl ether acetate, dipropylene glycol methyl ether acetate, butyl lactate, ethoxyethyl acetate, ethylene glycol monobutyl ether, ethylene glycol monobutyl ether acetate, ethyl ethoxy propionate, propylene glycol methyl ether acetate, propylene glycol monoethyl ether, and propylene glycol butyl ether.

10. The ink composition of claim 1, further comprising an adhesion promoter.

11. The ink composition of claim 10, wherein the adhesion promoter comprises a substituent forming a silanol group through hydrolysis, or molecules of the adhesion promoter comprise a methoxy silyl group or an ethoxy silyl group, and the ink composition comprises 0.1 parts by weight to 5.0 parts by weight of the adhesion promoter based on the total weight of the ink composition.

12. The ink composition of claim 1, further comprising at least one additive selected from the group consisting of a polymerization initiator and a binder.

13. The ink composition of claim 1, wherein the ink composition makes contact with a glass substrate at a contact angle of 30° to 60°.

14. A method of forming a pattern, comprising:
applying the ink composition of claim 1 or claim 2 using an inkjet printer; and
thermally treating the applied ink composition at a temperature of 130° C. to 250° C.

15. The method of claim 14, wherein the applying of the ink composition comprises heating a print head of the inkjet printer to a temperature of 40° C. to 80° C. so as to adjust viscosity of the ink composition to a range of 10 cP to 20 cP.

16. The method of claim 14, wherein the thermal treating is performed at a temperature of 160° C. to 200° C.

17. The method of claim 14, wherein the thermal treating is performed at a temperature of 220° C. to 250° C.

18. An etching mask formed using the ink composition of claim 1.

19. An insulation film formed using the ink composition of claim 1.

20. The ink composition of claim 2, wherein every 100 parts by weight of the ink composition comprises:
a) 60 parts by weight to 98 parts by weight of the polymerizable compound having an ethylenically unsaturated bond;
b) 0.01 parts by weight to 1.0 part by weight of the fluorinated surfactant; and
c) 0.001 parts by weight to 55 parts by weight of the solvent.

* * * * *